United States Patent
Hatfield et al.

[19]

[11] Patent Number: 5,920,830
[45] Date of Patent: Jul. 6, 1999

[54] METHODS AND APPARATUS FOR GENERATING TEST VECTORS AND VALIDATING ASIC DESIGNS

[75] Inventors: William Thomas Hatfield, Schenectady; Abdallah Mahmoud Itani, Ballston Spa; William Macomber Leue, Albany, all of N.Y.

[73] Assignee: General Electric Company, Schenectady, N.Y.

[21] Appl. No.: 08/890,273

[22] Filed: Jul. 9, 1997

[51] Int. Cl.$^6$ .............................. G01R 31/28; G06F 9/45; G06F 9/455

[52] U.S. Cl. .................... 702/119; 702/123; 395/701; 395/705; 371/27.4

[58] Field of Search ...................................... 364/578, 480, 364/481, 488, 489, 490; 371/22.1, 22.2, 27.1, 22.4, 27.4; 395/701, 702, 703, 704, 705, 707, 708; 702/117, 118, 119, 123

[56] References Cited

U.S. PATENT DOCUMENTS

| | | | |
|---|---|---|---|
| 5,282,146 | 1/1994 | Aihara et al. | 364/489 |
| 5,437,037 | 7/1995 | Furuichi | 395/700 |
| 5,452,227 | 9/1995 | Kelsey et al. | 364/489 |
| 5,537,580 | 7/1996 | Giomi et al. | 395/500 |
| 5,544,067 | 8/1996 | Rostoker et al. | 364/489 |
| 5,604,895 | 2/1997 | Raimi | 395/500 |
| 5,684,808 | 11/1997 | Valind | 371/22.3 |
| 5,696,771 | 12/1997 | Beausang et al. | 371/22.3 |
| 5,703,789 | 12/1997 | Beausang et al. | 364/489 |
| 5,726,902 | 3/1998 | Mahmood et al. | 364/489 |
| 5,727,187 | 3/1998 | Lemche et al. | 395/500 |
| 5,734,572 | 3/1998 | Guignet | 364/468.03 |
| 5,740,086 | 4/1998 | Komoto | 364/580 |
| 5,828,985 | 10/1998 | Sauer et al. | 702/122 |

OTHER PUBLICATIONS

Ganguly, et al., "HSIM1 & HSIM2: Object Oriented Algorithms for VHDL Simulation", IEEE, 1994.

*Primary Examiner*—Patrick Assouad
*Attorney, Agent, or Firm*—Marvin Snyder; Douglas E. Stoner

[57] ABSTRACT

Methods and apparatus for generating test vectors for use in testing ASIC designs at both the functional and circuit levels, and for comparing the results of functional level and circuit level tests, employ a set of software tools to facilitate generating test vectors and to compare results of simulation at the functional level with results of simulation at the synthesized circuit level. The software tool set includes a preprocessor program which reads source files and produces skeleton test vector files, a compiler program for compiling the test vector files, and an output comparison program for comparing functional level test results with circuit simulation level test results.

23 Claims, 3 Drawing Sheets

METHODS AND APPARATUS FOR GENERATING TEST VECTORS AND VALIDATING ASIC DESIGNS

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF THE INVENTION

This invention relates generally to application specific integrated circuits (ASICs) and, more particularly, to generating test vectors used for verifying an ASIC design.

BACKGROUND OF THE INVENTION

High-level specification languages for designing an application specific integrated circuit (ASIC) have made it possible for a chip designer to design an ASIC at a functional level rather than having to generate detailed schematic diagrams. Once the functional level description has been generated, software tools can be used to synthesize the functional level description to a circuit level implementation.

In addition to enabling design of an ASIC at a functional level, software tools also are available for simulating the ASIC at both the functional level and at the circuit level. Often it is necessary to perform simulations at both levels to ensure correct functionality and freedom from timing errors.

A complex ASIC design may require simulation using large amounts of test data, sometimes referred to herein as test vectors, to exercise all features of the ASIC and to ensure that all the components of the ASIC have been tested using the full ranges of buses, registers, and memories. Although "testbench" code can be used to generate test vectors for testing the functional level ASIC design, the process of generating such test vectors is labor-intensive. Also, test vectors written for simulation at the functional level may require changes to work when the synthesized circuit must be simulated.

For example, certain classes of ASIC applications such as digital beamforming for an ultrasound or radar system present a particular challenge for test vector generation. Specifically, digital beamforming ASICs are very complex and have many different operating modes. In addition, no simple test such as a Fourier Transform can be performed on the output data to ensure that the ASIC design functions correctly. Therefore, a variety of test vectors must be generated to exercise each ASIC functional mode, and human judgment must be used to examine the simulation output to decide if the desired functionality has been implemented correctly.

The above described process for generating test vectors for testing ASICs is a tedious and error-prone process. It would be desirable to provide a tool for more automated generation of such test vectors, including test vectors for complex ASICs such as digital beamforming ASICs. It also would be desirable for such tool to generate test vectors for both the functional level design and the circuit level design, and for such tool to compare the results from both levels of testing to ensure correct ASIC functionality and freedom from timing errors.

SUMMARY OF THE INVENTION

Methods and apparatus are described herein for generating test vectors which may be used in testing ASIC designs at both the functional and circuit levels and for comparing the results of functional level and circuit level tests. More specifically, a set of software tools is provided to facilitate generating test vectors and for comparing results of simulation at the functional level with results of simulation at the synthesized circuit level.

In one embodiment, the software tool set includes a preprocessor program (or preprocessor) which reads source files and produces skeleton test vector files, a compiler program (or compiler) for compiling the test vector files, and an output comparison program for comparing functional level test results with circuit simulation level test results. The compiler recognizes and compiles source programs written in a language sometimes referred to herein as "TS/L", which is a language created for test vector creation. More particularly, the preprocessor scans the functional level source code ASIC description which defines a circuit to be tested, and extracts information which is then used to build a skeleton program. The skeleton TS/L program identifies the interface descriptions for the circuit under test. The designer, using the skeleton program, then generates test specifications without having to extract signal information.

The compiler expands the test specifications into tabular stimulus files and generates, from the stimulus files, test vectors for both functional level and circuit level testing. The compiler therefore eliminates the tedious and time consuming process of a designer having to generate different sets of test vectors for different levels of testing.

The comparison program compares the results of two different simulation runs and generates a variation report highlighting any differences between the runs. One simulation run may be performed at the functional level and the other simulation run may be performed at the synthesized circuit level. Any differences between the two runs may indicate a design error that requires correction.

The above described tool set generates, in a more automated fashion, test vectors that can be used to confirm ASIC design, even for complex ASICs such as digital beamforming ASICs. Such test vectors are generated for both the functional level design and the circuit level design. The tool set also compares the results from both levels of testing to ensure correct ASIC functionality and freedom from timing errors.

DETAILED DESCRIPTION OF THE DRAWINGS

The invention is directed to a tool set which includes three main program components, or methods, for test vector generation to improve productivity in ASIC design. The program components are sometimes referred to herein as vhdl2tsp (preprocessor), tbgen (compiler), and tbcmp (comparison). The tool set can be loaded into and operated in a general purpose computer or a dedicated computer, either of which includes both a processor and a memory, and is not limited to practice on any one particular type of computer. The program components are loaded into the computer memory.

In general, the preprocessor is a utility processor which scans VHSIC (Very High Speed Integrated Circuit) Hardware Description Language (VHDL) source code that defines a circuit to be tested and extracts information used to build a skeleton TS/L program. VHDL is well known in the art. TS/L is a special language designed for high productivity in test vector design and generation, and is described hereinafter in more detail. The skeleton TS/L program identifies the interface descriptions for the circuit under test, thereby requiring the designer to only write the specification for the signal levels and timing which make up the test vector.

The designer uses the skeleton TS/L program to generate test vector data, and the TS/L test vector data is supplied to the compiler. The compiler transforms the input test vector data written in TS/L language into actual test vectors which can be used to stimulate a circuit under test. The test vectors generated by the compiler can be used to test both the functional level simulation and the circuit level simulation of a particular design.

Once the simulations are run using the test vectors generated by the compiler, the comparison program compares the output of a test vector run on a circuit level to the output of a simulation run on a functional level for the same circuit. The output of the comparator is a report indicating any timing and value errors.

As described above, the subject tool set automates generation of skeleton test vectors by parsing VHDL source code and using a special-purpose language, referred to herein as TS/L. In addition, the tool set generates test vectors that can be used at both the functional level and circuit level simulations. Further, the tool set automatically compares simulation run results and generates a report of differences between the runs.

Figure 1:
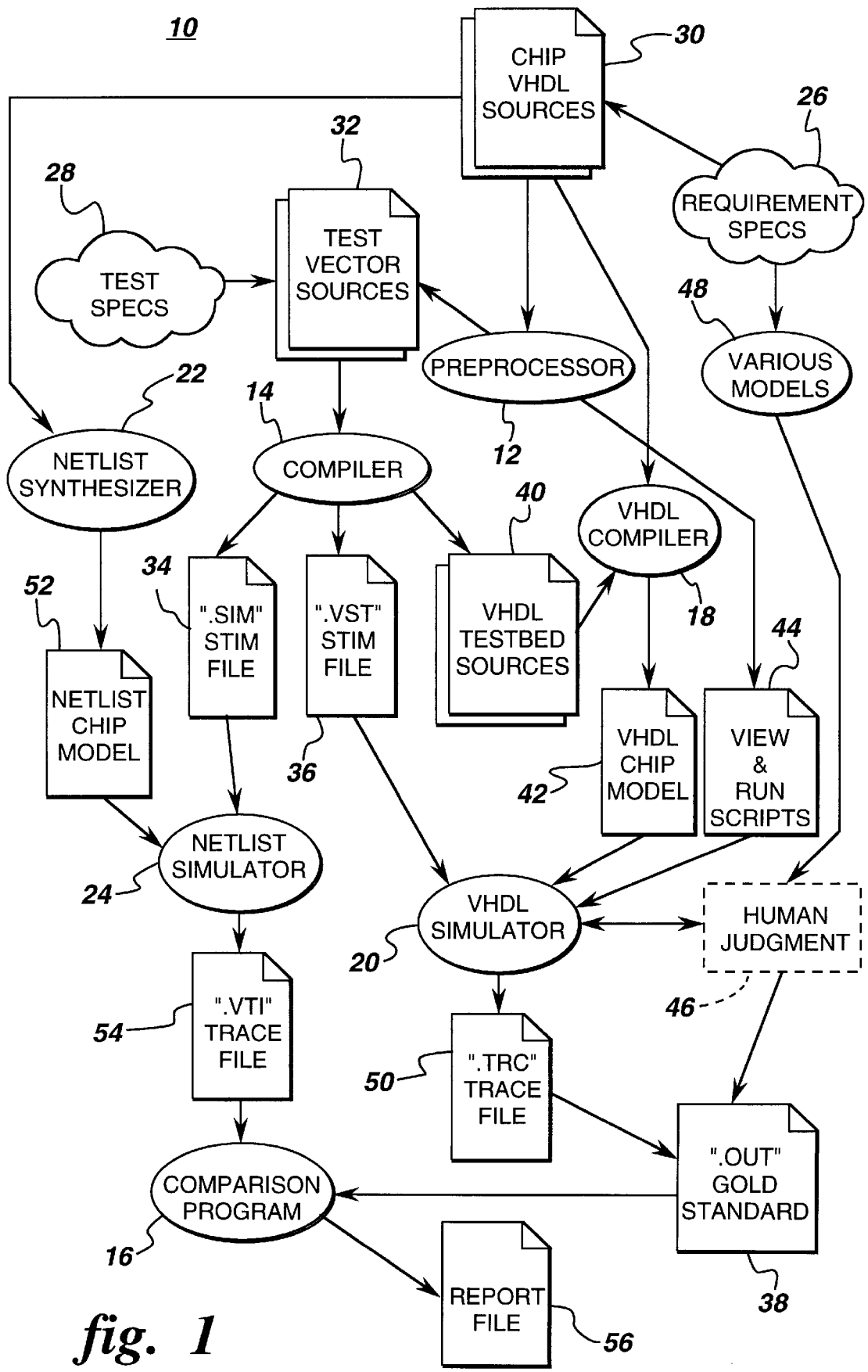
FIG. 1 is a data flow diagram illustrating operation of the present tool sets for confirming ASIC designs in accordance with one embodiment of the present invention.

FIG. 1 is a data flow diagram 10 illustrating the data flows in an ASIC design procedure using the tool set described above, in a computer. Rectangles with "dogeared" corners represent data files, and ellipses represent tools. Other than preprocessor 12, compiler 14 and comparison program 16, the tools illustrated in FIG. 1 are commercially available products and well known in the art. For example, VHDL compiler 18, VHDL simulator 20, netlist synthesizer 22, and netlist simulator 24 are well known, commercially available products.

Referring specifically to FIG. 1, the operator supplies requirement specifications 26 and test specifications 28 with respect to a particular ASIC design. Requirement specifications 26 are then converted to VHDL source data files 30 by the designer. Source data files 30 are supplied to preprocessor 12, and preprocessor 12 generates skeleton TS/L test vector files 32. The TS/L language is suitable for generating test vectors for the entire ASIC design, or for any subsection of it. TS/L can thus be used for generating test vectors throughout the entire design process, from the smallest component up to the completed design. Skeleton TS/L test vectors 32 identify the interface descriptions for the circuit under test.

Skeleton test vectors 32 and waveform definitions generated by the designer from test specifications 28 are then supplied to compiler 14. Compiler 14 transforms skeleton test vector source data file 32, written in TS/L, into actual test vectors used to stimulate a circuit under test. More specifically, compiler 14 generates a ".sim" stimulus data file 34 which contains test vectors used in circuit level simulations by netlist simulator. Compiler 14 also generates a ".vst" stimulus data file 36 which contains test vectors used in functional level simulations by VHDL simulator. Other data files generated by compiler 14 include a VHDL testbed sources data file 40 which contains the test vectors generated by compiler 14 as automatically-generated VHDL source code. After being converted to compiled binary form by VHDL compiler 18, the data is combined with the compiled code generated by the sources for VHDL chip model 42. The testbed code, during simulation by VHDL simulator 20, reads test vector stimulus files 36 and presents the waveforms therein to the circuit under test, and also takes the output signals from the circuit under test and writes them to the ".trc" trace file 50.

The functional level simulation is performed by VHDL simulator 20 which, using data from VHDL chip model data file 42, views and runs scripts from preprocessor 44. Using his training and detailed knowledge of the circuit under test (e.g., human judgment 46), the designer simulates a functional level operation of the circuit using test vectors from ".vst" data file 36. Output data from such simulation are supplied to ".trc" trace file 50. Once ".trc" trace file 50 is generated, the data in file 50 is scrutinized using human judgment 46, and when the data is satisfactory to the designer, the data in the ".trc" trace file 50 is deemed a so-called gold standard, i.e., ".out" gold standard file 38.

The industry-standard VHDL ASIC design language is a powerful tool for describing the desired behavior of an ASIC being designed. VHDL compiler 18 coupled with a VHDL simulator 20 allows the chip designer to verify much of the design by exercising the ASIC in simulation and observing waveforms, timing, and numeric variables as test vectors 36 are sent through the circuit. The VHDL simulation is, however, independent of any particular physical implementation of the ASIC. Specifically, the VHDL simulation need not be based on the geometry of the physical wires and transistors that will comprise the actual ASIC and therefore may not include realistic estimates of the timing changes which will inevitably occur when the ASIC is actually implemented.

Commercial software tools allow the VHDL design to be synthesized into actual gates and interconnections, producing a netlist chip model 52. The reduction of the VHDL abstractions into a concrete implementation adds a new level of realism to address to timing issues. Netlist chip model 52 can be simulated using commercial software tools, i.e., netlist simulator 24, and various timing problems can be identified and corrected. More specifically, netlist synthesizer 32, using data in VHDL sources data file 30, generates a data file containing netlist chip models 52. Simulator 24, using models 52 and test vectors from ".sim" stim data file 34, simulates the circuit. Output signals from such simulation are stored in a ".vti" trace file 54, constituting a post layout simulation result file. Comparison program 16 then performs a comparison of ".vti" trace file 54 and ".out" gold standard file 38. More specifically, comparison program 16 compares the output signals of the VHDL-based simulation run to the output signals of the netlist-based simulation run. The output signals of comparison program 16 make up a report file 56 which indicates timing and value errors, if any. Comparison program 16 is preferably designed to be easily-adaptable to parse different trace files from different commercial netlist simulators.

Although simulating the design at the netlist level makes certain timing problems visible, the ASIC design must be taken to a next level of realism by adding a physical layout identifying each transistor and wire in the ASIC. This layout process is also performed using commercial software tools. After layout is complete, a highly realistic estimate of the time delays which will be present in the ASIC can be extracted from the design and added to the simulation. This post-layout simulation is the final major stage of simulation required before the chip design can be committed to fabrication. The set of software tools described herein is applicable to both pre-layout and post-layout simulations.

Set forth below is a more detailed description of TS/L, and a more detailed description of each program component, i.e., preprocessor 12, compiler 14, and comparison program 16. Although these components are described herein in a specific ASIC test system, it should be understood that such components are not necessarily limited to practice in the specifically-described ASIC test system.

TS/L Language

TS/L is a relatively small language with simpler syntax and semantics as compared to most general-purpose programming languages. TS/L can be parsed efficiently using standard parsing algorithms. The lexical and syntax analysis are implemented using a finite-state lexical analysis and a stack-based pushdown machine similar to the techniques used in compilers for other computer languages. TS/L syntax and semantics are configured to make the language particularly efficient for generating test vectors.

A TS/L code generation system includes at least three separate generation modules which produce three distinct data outputs: (1) a tabular text file 36 containing time-stamped input signal values for the circuit under test, (2) several text files 40 containing VHDL language source code which form a "testbench" for use with a commercial VHDL compiler and simulator which read the tabular input signal values and present them to the circuit under test, and also produce tabular output signals during the VHDL simulation run, and (3) stimulus files 34 in the stimulus language of one or more commercial netlist simulators to be used for post-synthesis and post-layout simulation of the circuit under test.

The table in Appendix A uses standard Backus-Naur formalism (BNF) for specifying the syntax of TS/L, and in Appendix B, a small sample TS/L program is set forth. The language is defined in terms of abstract or non-terminal symbols which are then progressively refined and converted into actual names used in a program, or terminal symbols. The syntax is specified by a number of productions, where each production consists of a non-terminal symbol enclosed in angle brackets, the "consists of" operator ('::='), followed by an expression containing a mixture of terminal and non-terminal symbols and operators. Terminal symbols are shown in upper case and bold type to make them easy to distinguish from non-terminal symbols, although the TS/L compiler is case-insensitive. A vertical bar ('I') is the alternation operator (read as "-or"). Square brackets ('[]') usually denote optional parts of a production, although they are also used as terminal symbols in the 'bus width' specification. An ellipsis ( . . . ) shows a repeating part that can contain any number of similar parts, and is read "zero or more of". All other operators, such as commas, semicolons, curved parentheses, and curly brackets, are terminal symbols, even though such symbols are not capitalized. Although many productions span several lines, there is no implied formatting for actual TS/L programs, which are completely free-form. The productions are ordered from the most general non-terminal symbols toward more and more detailed parts of the language.

There are a number of other language features which are not captured conveniently using the Backus-Naur formalism. These include comments and include files. The TS/L comment delimiter is the character symbol '//'. Any characters following a comment character until the end of the current line are ignored by the parser. This feature is adopted from C++ programming language.

The statement #include "<filename>" where <filename> is a non-terminal symbol which resolves to an arbitrary string, indicates that processing of the current source file by the compiler is temporarily suspended. The designated file is opened if it exists and its contents are read into the lexical scanner input stream exactly as if the contents were in the original source file. When the contents of the "include file" have been exhausted, processing of the original file resumes on the line following the "#include" statement. A given source file may reference any number of include files, but include files themselves may not contain any further nested references to other include files. The "include file" feature is similar to that in C and C++ programming languages.

Preprocessor

Preprocessor 12 simplifies creating a correct list of signal declarations, and also ensures the overall syntactic and semantic correctness of the TS/L program. Preprocessor 12 scans the input VHDL source code for the circuit under test, extracts the information necessary for correct declarations of signals at the circuit boundary, and then uses the extracted information in generating a "skeleton" TS/L program which contains a test header, signal declarations, and an "empty" executable section. Helpful comments are also inserted into the skeleton by preprocessor 12 to guide the designer by describing the purpose of each statement the TS/L program, and indicate where the designer should add additional code to define the test vector states.

More specifically, preprocessor 12 includes a lexical scanner which reads the VHDL source file and tokenizes the character stream into primitive constructs such as identifiers, numbers, and operators. Preprocessor 12 also includes a syntax analyzer which recognizes parts of the VHDL syntax and extracts relevant information. The syntax analyzer is very small and simple because preprocessor 12 does not need to recognize more than a small subset of the full VHDL syntax; that is, only the entity and behavior declaration headers and the entity port list need to be analyzed fully. Preprocessor 12 also includes a simple symbol table block and an error handler.

Set forth below is an example of the skeleton TS/L program which may be generated by preprocessor 12 for a circuit designated as "focus_fifo".

```
//////////////////////////////////////////////
///
// Test program for component 'Focus_Fifo'
//////////////////////////////////////////////
///
TEST name( ) {
//
// COMPONENT CompiledLibraryName.ComponentName(BehaviorName)
//
    COMPONENT qcard.Focus_Fifo(Behave1);
//
// SOURCE("PathToComponentVHDLSourceFile")//
    SOURCE("/home/user/chip/synthesis/focu
fifo.vhd");
//
// SAMPLE   MasterClockName
(SampleStartingMasterClockPhase,
//         SampleIntervalMasterClockPhases);
//
    SAMPLE Clk40p0 (1, 1);
    INPUT PipeLineIn[10], SIGNED < 0;
    OUTPUT PipeLineOut[10], SIGNED < 0;
    INPUT Hold_Addr, UNSIGNED < 0;
    INPUT Ram-WEB, UNSIGNED < 0;
    INPUT WriteRam_Addr[7], UNSIGNED < 0;
    INPUT TPpulse[10], SIGNED < 0;
```

```
        INPUT TRegSelect, UNSIGNED < 0;
        CLOCK Clk40p0 (40.0) < 1;
        OUTPUT TRegDataOut[7], UNSIGNED < 0;
        INPUT ReadCountEn, UNSIGNED < 0;
        INPUT ReadStarting_Addr[7], UNSIGNED < 0;
//
// Put your PROTOCOL statements here, like this:
//   protocol ProtocolName (ArgumentCount) {
//     ProtocolStatement;
//     AnotherProtocolStatement;
//   };
// BEGIN
// Executable Statements which generate states go
// here.
// Here are some prototypes:
//
// parallel (MaxClockPhasestoGenerate) {
//    vector VectorName { VectorArgumentList };
//    vector AnotherVectorName {
VectorArgumentList };
// };
// END;
};
```

This program contains a list of signal declarations. These declarations must match the names, types, and bus widths of the signals which are at the boundary of the circuit under test. Any parameter mismatch or spelling error in this list will cause the simulation to fail. Since this program skeleton was automatically generated by reading the VHDL source code for the circuit under test, the chance of this kind of error is minimized, provided that the later human-edited changes to the code do not modify these declarations.

Compiler

Figure 2:
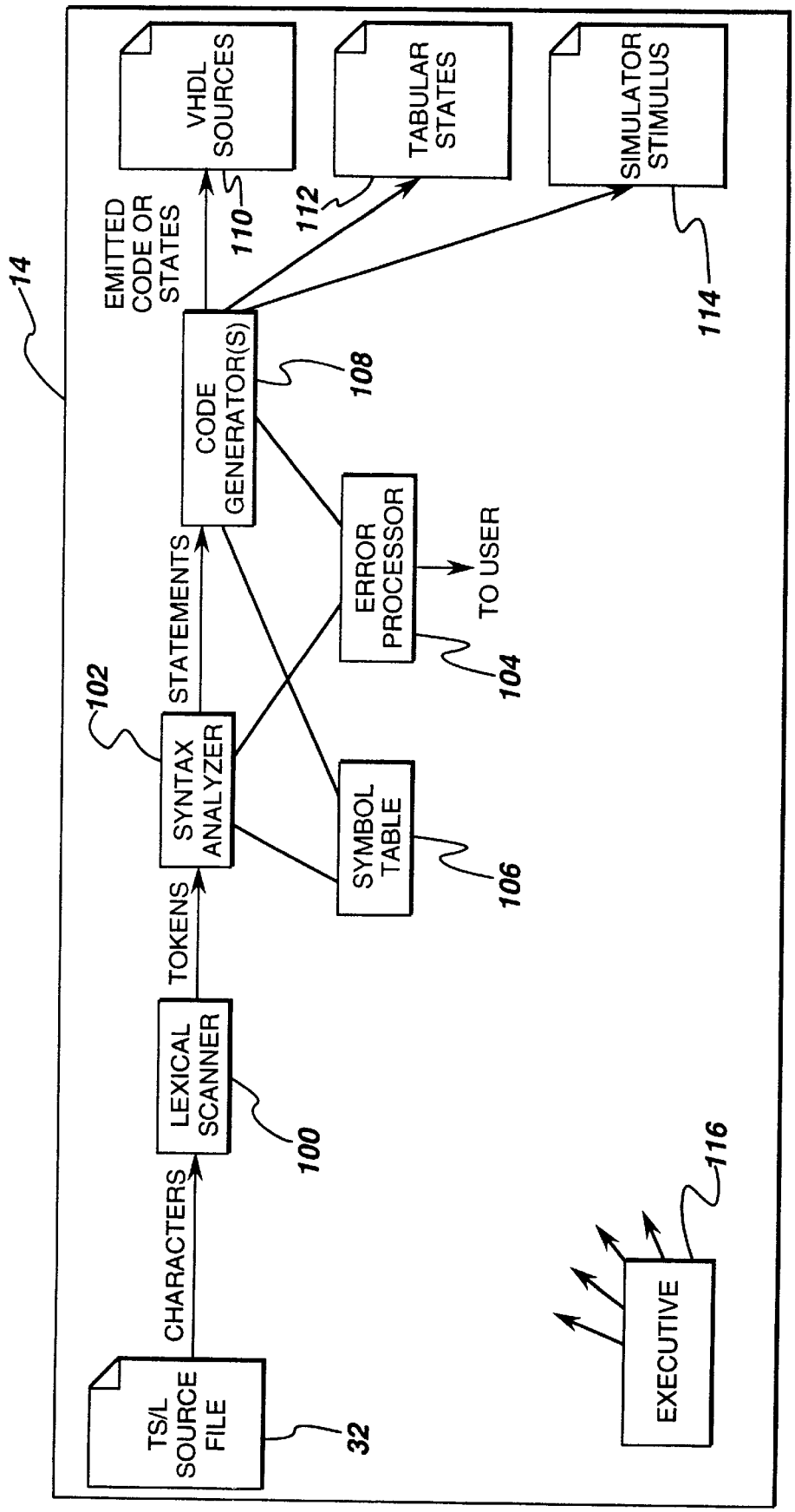
FIG. 2 is a functional block diagram of a compiler in accordance with one embodiment of the present invention.

FIG. 2 is a block diagram illustration of compiler 14 of FIG. 1 for the TS/L language. Compiler 14 includes a finite-state lexical scanner 100 which reads source file 32 character by character, strips off any comments and handles "include file" references, and clumps the remaining contents of TS/L source file 32 into tokens. A token represents a primitive language construct such as an identifier, a numeric constant, and an operator. Lexical scanner 100 presents a stream of tokens to a syntax analyzer 102, which picks the appropriate productions from among the numerous productions and applies them recursively until complete statements are recognized as legitimate statements in the TS/L language, or until a syntax error is detected.

Syntax and semantic errors are handled by an error processor 104 which assembles a textual error message showing the error type and its location in source file 32, and delivers this message to the user. Syntactically legitimate declarations are further processed by entering their contents in a compressed binary form into a symbol table 106 kept in memory. Syntactically legitimate executable statements are further processed by invoking a code generator 108 to emit VHDL code 110, tabular state tables 112, or stimulus states 114 for a commercial ASIC simulator. Each of the functional systems described above, i.e., lexical scanner, syntax analyzer, symbol table, error processor, and code generator, includes a number of modules to perform the functions. An executive module 116 controls the sequence of module execution.

Comparison Program

Figure 3:
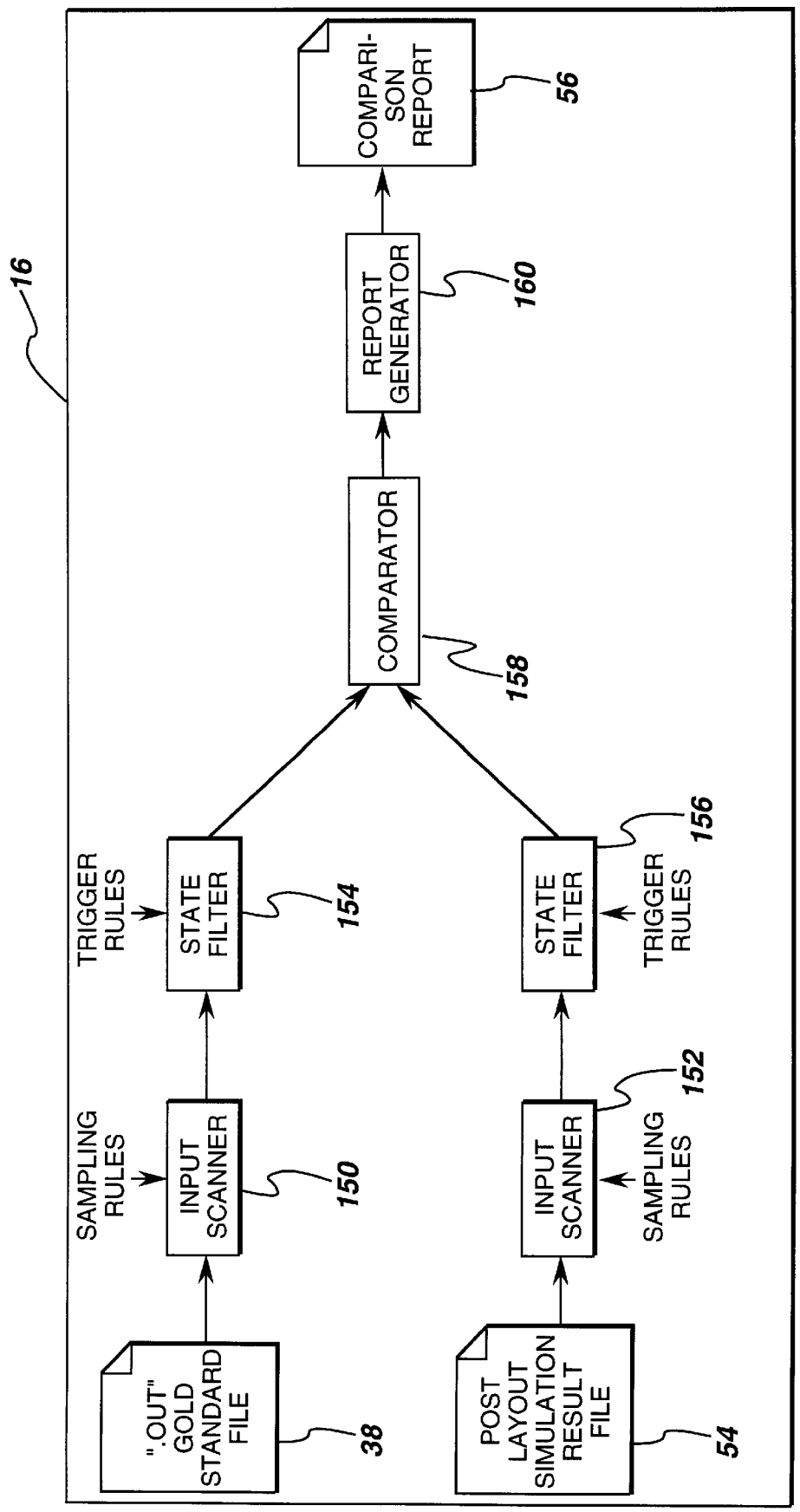
FIG. 3 is a functional block diagram of a comparison program architecture in accordance with one embodiment of the present invention.

FIG. 3 illustrates the architecture of comparison program 16 of FIG. 1, wherein result files 38 and 54 from two different simulation runs are read by input scanners 150 and 152. VHDL result file 38 and post-layout result file 54 are shown as the input files in FIG. 1.

Result files 38 from simulations at the VHDL level have a format essentially identical to the tabular stimulus file format. The only difference is that result file 38 contains values for output signals as well as input signals to the circuit under test. Post-layout simulation result files 54 differ in content and format depending on the vendor selected for the post-layout simulation software. In general, post-layout simulation result file 54 will be in a tabular format, with one line for each new set of signal values, interspersed with error reports about problems such as setup and hold violations.

Different types of input scanners may be selected depending on the particular syntax of the result files being processed. Comparison program 16 (FIG. 1) determines which input scanner to use based on the filename extension. Each input scanner 150 and 152 is responsible for stripping off comments and other irrelevant result file content, and also for detecting and processing any error messages encountered in result files 38 and 54. Input scanners 150 and 152 also apply the sampling rules taken from the arguments to the SAMPLE statement to accept or discard signal states.

State filters 154 and 156 apply the trigger rules for deciding when to begin comparing signal values based on arguments to the SAMPLE statement. State filters 154 and 156 also convert the textual representation of signal values and timing found in result files 38 and 54 of FIG. 1 to binary formats and package them for presentation to comparator 158.

Comparator 158 compares matching signal values at matching times and records when they differ. Report generator 160 then formats the output data of comparator 158 into a human-readable form and writes text report file 56.

As explained above, comparison program 16 performs comparisons between the results of simulations run at the VHDL level with post-layout simulations performed using commercial tools. The SAMPLE and COMPARE statements in the TS/L program are included to support comparison of results of simulations run at different design levels. The SAMPLE statement is used by comparison program 16 to determine how often and where to sample state information from a simulation result file. A typical SAMPLE statement is set forth below.

SAMPLE Clk40p0(1, 1);

The term SAMPLE is a keyword which identifies this line as a SAMPLE statement to compile. The string ° Clk40p0' is the name of the master clock signal for the circuit under test. The first numeric argument '1' instructs compiler 14 to begin sampling the result file on the second clock phase found (clock phases are counted from zero). The second numeric argument '1' instructs compiler 14 to sample the rest of the result file at intervals of 1 clock phase, that is, on every clock phase. If the results from the simulation are only valid at coarser intervals, for instance, on every fourth rising edge of the master clock, then the designer could choose to make the second numeric argument equal to 8, which means that every 8 clock phases would be sampled, which would be every fourth rising edge.

The COMPARE statement is used by comparison program 16 to determine when to begin comparing the results from one simulation with the results from another one. A typical COMPARE statement is set forth below.

COMPARE Start(1, 57, 1);

The term COMPARE is a keyword which identifies this line as a COMPARE statement to compiler 14 (FIG. 1). The string 'Start' is the name of the signal which compare program 16 monitors to determine when to begin comparisons. The first numeric argument '1' is the value which the signal 'Start' will have when compare program 16 should start comparisons. The second numeric argument '57' is the number of master clock phases which should be allowed to elapse after 'Start' takes on a value of 1 before comparisons begin. The COMPARE statement is thus a software equivalent to an oscilloscope delayed trigger mechanism. The third argument '1' instructs comparison program 16 as to which edge of the master clock should be used for comparisons of subsequent signal states: 1 means the rising edge, 0 means the falling edge, and 2 means both edges.

The above described tool set generates test vectors which can be used to confirm ASIC design, even for complex ASICs such as digital beamforming ASICs. Such tool set also generates test vectors for both the functional level design and the circuit level design, and compares the results from both levels of testing to ensure correct functionality and freedom from timing errors.

Converting VHDL Code To C++ Executable Code

In order to simulate a chip at many different levels so as to build confidence in the design and in implementation of the design, a simulation of the chip at many different levels typically must be performed. To simulate a chip, the actual VHDL implementation must be matched bit-for-bit, and the simulations may need to be run on multiple parallel computers. To facilitate performing the simulation, the VHDL source code should be translated to a language such as C++ which, when compiled, can simulate operation of the chip at any stage of its development. The following description relates to one embodiment of a translator for translating the VHDL source code to C++.

To understand the process of automatically converting VHDL code to C++ executable code, the structure of a VHDL design should be considered. Specifically, the basic unit of a VHDL design is an Entity. An Entity has associated with it an Architecture and that architecture is described by a Behavior which consists of components and processes. The Entity declaration describes the interface to the component. For example, the entity description for a half adder is set forth below.

```
entity Half_adder is
    Port    (X:in Bit;
            Y:in Bit;
            sum:out Bit;
            carry:out Bit);
end Half_adder;
```

The Architecture Body is an internal description of the behavior of the device. Using the half adder again as an example, the architecture is set forth below.

```
architecture Behavel of Half_adder is
    Begin
        process (X, Y)
            sum <= X xor Y;
            carry <= X and Y;
        end process;
end Behave1;
```

Here there are two types of assignment operators in VHDL. The ":=" operator is used when the left hand argument is to take on its new value immediately. The "<=" operator is used when the left hand argument will take in its new value at the end of the current simulation cycle or after a specified delay time. Assignments can also be dependent on events such as a clock edge. For example:

```
if(Clk'EVENT and Clk = 1) {
    B <= A;
    C <= D;
}
``` describes the behavior of two flip-flops clocked by a common clock.

Components are coupled together to form more complex structures. For instance, a full adder could be made from two half adders as follows.

```
entity Full_adder is
    Port(A:in Bit;
         B:in Bit;
         Carry_in:in Bit;
         AB:out Bit;
         Carry_out:out Bit);
end Full_adder;
architecture Sturcture of Full_adder is
    signal Temp_Sum:Bit;
    signal Temp_carry_1:Bit;
    signal Temp_carry_2:Bit;
    component Half_adder
        port    (X:in Bit;
                Y:in Bit;
                Sum:out Bit;
                Carry:out Bit);
    end Component;
    component Or_gate
        port    (In1:in Bit;
                In2:in Bit;
                Out1:out Bit);
    end component;
    Begin
        U0: Half_adder
            port    map     (X => A,
                            Y => B,
                            Sum => Temp_sum,
                            Carry => Temp_carry_1);
        U1: Half_adder
            port    map     (X => Temp_sum,
                            Y => Carry_in,
                            Sum => AB,
                            Carry => Temp_carry_2);
        U3: Or_gate
            port    map     (In1 => Temp_carry_1,
                            In2 => Temp_carry_2,
                            Out1 => Carry_out);
    end Structure;
```

From the above description, it can be seen that the full adder is made up of three components, i.e., two half adders and an or-gate. The "port maps" describe how these three components are connected together. Signals can be thought of as wires which transmit information between processes. Variables however are local to a process.

In addition, VHDL has several different data types: integer, standard logic, standard unsigned logic, standard logic vector, standard unsigned logic vector, and signed vector. These data types each have their own characteristics based on the operators used with each data type.

In order to convert VHDL code to C++ executable code, and in accordance with one embodiment of the invention, "classes" are created which implement the VHDL data types. The behavior of each data type for all operators is then described (this process is generally referred to as "overloading"). For example, the header file for a class which describes the behavior of integers is set forth below.

```
class integer:public Queue {
    friend ostream& operator << (ostream&, const
        integer&);
    friend int operator==(const int, const
integer&);
    friend int operator < (const integer&, const int);
    friend int operator < (const integer&, const
        integer&);
    friend integer operator*(const integer&, const
int);
    friend integer operator*(const integer&, const
        integer&);
    friend integer operator/(const integer&, const
int);
    friend integer operator+(const integer&, const
int);
    friend integer operator+(const integer&, const
        integer&);
    friend integer operator+(const integer&, const
        std_ulogic&);
    friend integer operator-(const integer&, const
        integer&);
    friend integer operator-(const integer&, const
        int);
    friend integer operator|(const integer&, const
        int);
    friend int ToClockedInt(const integer&);
    friend int To_Int(const integer&);
    friend signed_vector To_SignedVector(const
integer,
        const int);
    friend std_logic_vector To_StdlogicVector(const
        integer, const int);
    friend std_ulogic_vector
To_StdUlogicVector(const
        integer&, const int);
    friend integer To_Integer(const signed_vector&);
    friend integer To_Integer(std_logic_vector&);
    friend integer To_Integer(std_ulogic_vector&);
    friend integer BitField(signed_vector&, int, int);
    friend integer BitField(std_logic_vector&, int,
        int);
    friend integer BitField(std_ulogic_vector&, int,
        int);
public:
    integer(int p = 0, int c = 0) {init(p, c);}
    int operator==(const integer&);
    int operator==(const int);
    interger operator==(const integer rhs);
    interger operator==(const int rhs);
    interger operator<=(const integer rhs);
    interger operator<=(const int);
    interger operator<=(const unsigned char);
    interger operator&(const int);
    interger operator&(const integer);
    interger operator|(const integer);
    interger operator<<(const int);
    interger operator~( );
    operator int( ) { return ip; }
private:
    void init(int, int);
    void UpdateObject( );
    int ic;
    int ip;
};
```

For all data types, there must be two values: the present value and the value at the end of the next simulation cycle. In the case of integers, "ip" represents the present value and "ic" represents the value that will be taken on at the end of the next simulation cycle. The behavior operator is described separately—for instance, the "*" operator for an integer, and an example is set forth below.

```
integer operator * (const integer& op1, const int
        op2) {
    return (op1.ip * op2);
}
```

The VHDL simulation cycle starts by updating any signals that have changed as a result of the last cycle. The simulator then checks for processes that are dependent on signal changes to run. Any that are found are executed. These processes may cause other signals to change which in turn may cause other processes to change. The process is repeated until all signals have been updated and all signal dependent processes have run. In order for the C++ program to behave like the simulator, a Queue class is created. All other classes inherit from this class. The purpose of this class is to create a queue of signals and "EVENTS".

```
typedef
class Queue {
    public:
        int OnQueue;
        /*Indicates that the variable is on the Update
            Queue */
        int Update;
        /* Indicates that the variable requires updating */
        int EVENT;
        /* Indicates that the variable value has changed
            since the last cycle */
        Queue *Next;
        virtual void UpdateObject( ) = 0;
};
```

As each process executes, signals which update at the beginning of the next simulation cycle are enqueued. At the end of each simulation cycle, the queue is checked and signals which have changed are updated and their "EVENT" flag is set. The simulation is run again so that event driven processes can run.

Once the classes are set up, the VHDL code is parsed and converted into syntax that a C++ compiler will accept. The parser can be written in C or a combination of lex and yacc (commonly available with unix systems). An example of a VHDL routine and its C++ code equivalent are given Appendix C. In the C++ code, the VHDL code has been left in but commented out in many cases to aid in understanding intent of the code. The translator can be implemented in many alternative forms, including on commerically available computer workstations.

While only certain preferred features of the invention have been illustrated and described, many modifications and changes will occur to those skilled in the art. It is, therefore, to be understood that the appended claims are intended to cover all such modifications and changes as fall within the true spirit of the invention.

RD-24,288

A-1

Appendix A
Copyright (C) General Electric Company 1996

```
<program> ::= <test_header> { <declaration_section>
<executable_section> };

<test_header> ::= TEST <test_name> ( )

<test_name> ::= <identifier>

<declaration_section ::= <declaration>; [ <declaration>; ... ]

<executable_section> ::= BEGIN
                            <executable_statement>;
                        [ <executable_statement>; ... ]
                        END;
<declaration> ::= <constant_declaration> | <signal_declaration>
                  <sample_declaration> | <component_declaration>
                  <source_declaration> | <protocol_declaration>

<constant_declaration> ::= CONST <const_identifier>
<assign_operator> <constant_expression>
<signal_declaration> ::= <regular_signal_declaration> |
                         <clock_signal_declaration>

<regular_signal_declaration> ::=
<signal_name> <regular_signal_type>
            [ ,<bus_width_spec> ] [ ,<radix_spec> ],
            [ ,<sign_spec> ] [ <assign_operator>
<constant_expression> ]

<clock_signal_declaration> ::= CLOCK <signal_name>
                               ( <frequency_spec>
                                 [ , <phase_spec> ] )
                               [ <assign_operator>
<constant_expression> ]

<sample_declaration> ::= SAMPLE <signal_name> ( <signal_value>,
<starting_clock_phase>)

<component_declaration> ::= COMPONENT <component_name> (
<behavior_name> )

<source_declaration> ::= SOURCE ( " <source_path_string> " )

<protocol_declaration> ::= PROTOCOL <identifier> (
<argument_count> )
                            {
                                <protocol_executable>;
                            [       <protocol_executable>; ...   ]
                            };

<executable_statement> ::=    <sync_statement> |
                              <wait_statement>
                              <protocol_expansion_statement> |
                              <assignment_statement> |
<vector_statement> |
                              <compare_statement> | <parallel_block>

<protocol_executable> ::=    <sync_statement> |
<wait_statement> |
```

RD-24,288

A-2

<assignment_statement>

<sync_statement> ::= SYNC ( <edge_spec> [,<delay_spec>] )

<wait_statement> ::= WAIT ( <phase_count> [,<delay_spec>] )

<protocol_expansion_statement> ::= <protocol_name> (
[<protocol_arguments>] )

<vector_statement> ::= VECTOR  [(<length_expression>)]
<identifier>[(<edge_spec>)]
( <vector_list> )

<compare_statement> ::= COMPARE <signal_name>   (  <signal value>,
<holdoff_phase_count>
[,<compare_flags>] )

<parallel_block> ::= PARALLEL
{
<parallel_statement>;
[<parallel_statement>; ...]
}

<parallel_statement>  ::=  <vector_statement | <sync_statement> |
<wait_statement> |
<assignment_statement>

<vector_list> ::= <vector_value> [, <vector_value> ... ]

<vector_value> ::= <integer_constant> | <vector_function>

<vector_function> ::= RAMP         (    <start_value>,
<end_value>,
<step_value>,
<count> ) |

MARCH    (        <march_value>,
<start_value>,
<start_bit_position>,
<end_bit_position> ) |
SINE    (          <starting_phase>,
<ending_phase>,
<peak_amplitude>,
<count> ) |
RAND    (         <minimum_value>,
<maximum_value>,
<weighting>,
<count> )
FROM    (         <logical_expression> )

<identifier> ::= <alphabetic_char> [<alphanumeric_char>...]

<const_identifier> ::= <identifier>

<assign_operator> ::= ⇐

<constant_expression> ::= <const_term> | <const_term> <addop>
<const_term>

<const_term> ::= <const_node> | <const_node> <mulop> <const_node> |
( <constant_expression> )

<const_node> ::= <numeric_constant> | <const_identifier>

23

RD-24,288

A-3

```
<addop> ::= + | -

<mulop> ::= * | /

<logical_expression> ::= <log_term> | <log_term> <log_dyadic_op>
<log_term>

<log_term> ::= <signal_name> | <const_node> |
               NOTE (<logical_expression>) |
               <relop> (<log_term>, <log_term> )

<log_dyadic_op> ::= AND | OR | XOR

<relop> ::= EQ | NE | LT | LE | GT | GE

<regular_signal_type> ::= INPUT | OUTPUT | INOUTPUT

<frequency_spec> ::= <positive_integer_constant> [
<frequency_units> ]

<frequency_units> ::= KHZ | MHZ

<phase_spec> ::= <time_expression>

<time_expression> ::= <non_negative_integer_constant> [
<time_units> ]

<time_units> ::= NS | US | MS | S

<bus_width_spec> ::= [ <positive_integer_constant> ]
        note: the square brackets are terminal symbols in this
production.

<radix_spec> ::= RADIX ( 10 | 16 )

<sign_spec> ::= SIGNED | UNSIGNED

<signal_name> ::= <identifier>

<signal_value> ::= <constant_expression>

<starting_clock_phase> ::= <constant_expression>

<clock_phase_step> ::= <constant_expression>

<holdoff_phase_count> ::= <constant_expression>

<component_name> ::= <identifier>

<behavior_name> ::= <identifier>

<source_path_string> ::= <arbitrary string of characters>

<argument_count> ::= <non_negative_integer_constant>

<edge_spec> ::= <edge_count>*<edge_value>

<edge_count> ::= <positive_integer_constant> edge_value> ::= 0 | 1

<delay_spec> ::= <time_expression>

<phase_count> ::= <positive_integer_constant>
```

RD-24,288

A-4

```
<protocol_name> ::= <identifier>

<protocol_arguments> ::= <constant_expression>
[,<constant_expression> ...]

<length_expression> ::= <constant_expression> compare_flags ::= <constant_expression>

<numeric_constant> ::= <integer_constant> | <floating_constant>

<integer_constant> ::= <decimal_constant> |
<hexadecimal_constant>

<decimal_constant> ::= [numeric_character]
[<numeric_character>...]

<numeric_character> ::= 0|1|2|3|4|5|6|7|8|9

<hexadecimal_constant> ::= 0x<hex_character>
[<hex_character>...]

<hex_character> ::= = 0|1|2|3|4|5|6|7|8|9|A|B|C|D|E|F

<floating_constant> ::= <integer_constant>.[<integer_constant>]

<alphabetic_character> ::= a character from the set {A-Z, a-z,
and '_'}

<alphanumeric_character> ::= a character from the set {A-Z, a-z,
0-9, and '_'}

<start_value> ::= <constant_expression>

<end_value> ::= <constant_expression>

<step_value> ::= <constant_expression>

<count> ::= <constant_expression>

<march_value> ::= 0 | 1

<start_value> ::= <hexadecimal_constant>

<start_bit_position> ::= <non_negative_integer_constant>

<end_bit_position> ::= <non_negative_integer_constant>

<starting_phase> ::= <constant_expression>

<ending_phase> ::= <constant_expression>

<peak_amplitude> ::= <constant_expression>

<minimum_value> ::= <integer_constant>

<maximum_value> ::= <integer_constant>

<weighting> ::= 0 | 1 | 2
```

RD-24,288

B-1

```
                Appendix B
  Copyright (C) General Electric Company 1996
///////////////////////////////////////////////
/////////////// //
// circuit_defs.tsp
//
// Interface definitions for demo ASIC
//
// Super-synchronous requirements:
//    All input bus signals have their diamonds on the rising
//    edge of the clock except for esi_0 through esi_3; these
//    have the diamonds 1 nsec after the falling edge. (The 1
//    nsec delay was to keep the VHDL model happy; this delay
//    isn't really necessary for the post-layout simulation,
//    but doesn't hurt.)  All input 1-bit control signals have
//    ALL their transitions on the rising edge of the clock
//    except for:
//       cs_N -> 1 : rising edge
//       cs_N -> 0 : falling edge
//       we_N -> 1 : falling edge
//       we_N -> 0:  rising edge
///////////////////////////////////////////////////
///
//
// Various constants
//
  CONST Mem1Size <= 64;
  CONST Mem2Size <= 128;
  CONST Mem1Access <= 0x02;
  CONST Mem2Access <= 0x01;
  CONST ClearAccess <= 0x00;
  CONST len0 <= 500;
  CONST len1 <= 250;
  CONST len2 <= 166;
  CONST len3 <= 125;
  CONST slen <= 1000;
  CONST len <= 2000;
  CONST mlen <= 5000;
  CONST llen <= 10000;
  CONST llen2 <= 12000;
  CONST flen <=127;
  CONST UnitDelay <= 1ns;

//
// Constants for Test Comparison Control
// Pick at most one from each magnitude group for 3rd argument
// to COMPARE, e.g.:
//     COMPARE Rstart(0, 0, NOREGOPTIMIZE+IO_ONLY+BOTH_EDGES);
//
  CONST FALLING_EDGE <= 0;
  CONST RISING_EDGE <= 1;
```

RD-24,288

B-2

```
    CONST BOTH_EDGES <= 2;
    CONST NORMAL <= 100;
    CONST IO_TEST <= 200;
    CONST IO_ONLY <= 300;

CONST NOREGOPTIMIZE <= 1000;

CONST NARROW <= 10000;

//
// Identify the compiled library location (qcard), component
// identifier (qcard_synthesis), and architecture name
// (Behave1).
//

COMPONENT circuit_synthesis(Behave1);

//
// Identify the top-level component source file path.
//

SOURCE("/home/user/circuit_synthesis.vhd");

//
// Specify the Trace File Sampling Interval and Start of
// Compare Sampling is on every master clock edge,
// starting on the first edge (1st two args)
// Compare Trigger is signal 'Rstart' going to 1. (3rd arg)
// No extra delay before compare starts. (4th arg)
//

SAMPLE Rstart(1, 1, 1, 0);

//
// Here is the Signal List
// Signal names ending in "_N" are low-true and should be
// initialized to 1.
// The master clock should also be initialized to 1.
//

INOUTPUT dio[16], RADIX(16),  UNSIGNED <= 0;
    INPUT adr[6],                 UNSIGNED <= 0;
    INPUT cs_N,                   UNSIGNED <= 1;
    INPUT we_N,                   UNSIGNED <= 1;
    INPUT esi_0[10],              SIGNED   <= 0;
    INPUT esi_1[10],              SIGNED   <= 0;
    INPUT esi_2[10],              SIGNED   <= 0;
    INPUT esi_3[10],              SIGNED   <= 0;
    INPUT GrabOffset,             UNSIGNED <= 0;
    INPUT dfstop,                 UNSIGNED <= 0;
```

RD-24,288

B-3

```
   INPUT apoen,                    UNSIGNED <= 1;
   INPUT softner,                  UNSIGNED <= 0;
   INPUT Rstart,                   UNSIGNED <= 0;
   OUTPUT RightPipe_Out[17],       SIGNED   <= 0;
   OUTPUT LeftPipe_Out[17],        SIGNED   <= 0;
   INPUT RightPipe_In[17],         SIGNED   <= 0;
   INPUT LeftPipe_In[17],          SIGNED   <= 0;
   CLOCK           clock( 40.0)             <= 1;
   INPUT Rreset_N,                 UNSIGNED <= 1;
   OUTPUT adclk_0,                 UNSIGNED <= 0;
   OUTPUT adclk_1,                 UNSIGNED <= 0;
   OUTPUT adclk_2,                 UNSIGNED <= 0;
   OUTPUT adclk_3,                 UNSIGNED <= 0;
   OUTPUT daclk_R,                 UNSIGNED <= 0;
   OUTPUT daclk_L,                 UNSIGNED <= 0;

//
// Protocol for Generating a RESET Sequence
// protocol reset(0) {
    sync (1*1);
    Rreset_N <= 0;
    wait (6);
    Rreset_N <= 1;
  };

protocol reset_N(0) {
    sync (1*1);
    Rreset_N <= 0;
    wait (6);
    Rreset_N <= 0;
  };

//
// Protocol for Writing to a Control Register
// protocol WriteReg(2) {
    sync (1*1);
    adr <= %1;
    dio <= %2;
    we_N <= 0;
    wait (1);
    cs_N <= 0;
    wait (3);
    cs_N <= 1;
    wait (1);
    we_N <= 1;
  };
```

RD-24,288

B-4

```
//
// Protocol for Reading from a Control Register
//
  protocol ReadReg(1) {
    sync (1*1);
    adr <= %1;
    dio <= Z;
    wait(1);
    cs_N <= 0;
    wait (3);
    cs_N <= 1;
  };

//
// Protocol for Changing Rstart
//
  protocol Do_Rstart(1) {
    sync (1*1);
    Rstart <= %1;
  };

//
// Write the next value to internal RAM1.
//
  PROTOCOL WriteMem1(1) {
    sync (1*1);
    adr <= 29;
    dio <= %1;
    we_N <= 0;
    wait (1);
    cs_N <= 0;
    wait (3);
    cs_N <= 1;
    wait (1);
    we_N <= 1;
  };

//
// Write the next value to internal RAM2.
//
  PROTOCOL WriteMem2(1) {
    sync (1*1);
    adr <= 28;
    dio <= %1;
    we_N <= 0;
    wait (1);
    cs_N <= 0;
    wait (3);
    cs_N <= 1;
```

RD-24,288

B-5

```
    wait (1);
    we_N <= 1;
  };

//
// Read the next value from the internal RAM1.
//
  PROTOCOL ReadMem1(0) {
    sync (1*1);
    adr <= 29;
    dio <= Z;
    wait(1);
    cs_N <= 0;
    wait (3);
    cs_N <= 1;
  };

//
// Read the next value from the internal RAM2.
//
  PROTOCOL ReadMem2(0) {
    sync (1*1);
    adr <= 28;
    dio <= Z;
    wait(1);
    cs_N <= 0;
    wait (3);
    cs_N <= 1;
  };

//
// Protocol for Setting Memory Access Bits;
//
  PROTOCOL SetMemAccess(1) {
    sync (1*1);
    adr <= 27;
    dio <= %1;
    we_N <= 0;
    wait (1);
    cs_N <= 0;
    wait (3);
    cs_N <= 1;
    wait (1);
    we_N <= 1;
  };

//
// Used at the end of a test to make sure all inputs are
// set to 'neutral' values. Note: the timing is important
// -- all timing must respect 'super-synchronous'
// constraints. Also must disable writes first to avoid
```

RD-24,288

B-6

```
// bidirectional bus conflicts.
//
  protocol flush(0) {
    sync(1*1);
    cs_N <= 1;              // rising edge
    wait(1);
    we_N <= 1;              // falling edge
    wait(1);
    dio <= 0;               // rising edge
    adr <= 0;
    Rreset_N <= 0;
    GrabOffset <= 0;
    dfstop <= 0;
    apoen <= 1;
    softner <= 0;
    RightPipe_In <= 0;
    LeftPipe_In <= 0;
    Rstart <= 0;
    wait(4);
    Rreset_N <= 1;
    sync(1*0, UnitDelay);
    esi_0 <= 0;             // falling edge + UnitDelay
    esi_1 <= 0;
    esi_2 <= 0;
    esi_3 <= 0;
    sync(4*1);
  };
//
// Comparison Routine.
//
TEST validation_100() {

// this include file contains the signal definitions
// for the circuit under test. #include "circuit_defs.tsp"
BEGIN // Tells the comparison program where to start comparing
// outputs.
COMPARE Rstart(1, 116);

// Load all Registers
// Address, Data (data in hex or decimal)
    VECTOR WriteReg {
      0, 0xff11,
      1, 0x01f0,
      2, 0x8010,
      3, 0xe0e0,
      4, 0xe0e0,
      5, 0x0100,
      6, 0x0100,
      7, 0x0100
```

B-7

```
 };

//Allow some startup time and sync to a rising
clock edge.
    wait(2);
    sync(1*1);

//Raise the 'start' signal.
    Rstart <= 1;

// Here are the test vectors.
// The 4 input buses esi0 through esi_3 each get different
// integer ramps, with transitions on clock falling edges plus
// a small delay so that the transitions don't fall exactly on
// the clock edges.
    parallel {
         vector esi_0(1*0,UnitDelay)   {
ramp(0,0,0,16),ramp(-512,511,4,llen) };
         vector esi_1(1*0,UnitDelay)   {
ramp(0,0,0,16),ramp(511,511,4,llen) };
         vector esi_2(1*0,UnitDelay)   {
ramp(0,0,0,16),ramp(-512,-512,4,llen) };
         vector esi_3(1*0,UnitDelay)   {
ramp(0,0,0,16),ramp(0,0,4,llen) };
         vector GrabOffset { wait(100,UnitDelay),1 };
         vector dfstop     { wait(2,UnitDelay),0 };
         vector apoen      { wait(2,UnitDelay),0 };
         vector softner    { wait(2,UnitDelay),0 };
    };
    END;
}
```

RD-24,288

C-1

Appendix C
Copyright (C) General Electric Company 1996

1.  VHDL Code

```
--   Title      :  QCARD (QuadChannelAsicReceiveDelay)
--                 Synthesis Version ASIC Core Interface
--   File name  :  input_if.vhd
--   Author     :  Al Itani
--   Created    :  Wednesday January 11, 1995 15:40:00
--   SCCS Revision : 1.15
--   SCCS Rev Date : 8/17/95 16:06:21
--
--   VHDL Work Library   :  Qcard
--
--   Module Function Description : Input section need 1 for
--   each channel, 4 total
--
-- The input stage of the QCARD clocks in the ADC data,
-- converts the input ADC data to two's complement
-- representation, and performs DC offset adjustments.
-- First, an input register clocks in the 10-bit ADC data on
-- the rising edge of the 40 MHz clock. Although the ADC data
-- is always clocked into QCARD on the rising edge, the ADC
-- clock may be inverted by setting the ADCCKInv bit (Register
-- 26) high. Next, the data goes into the Input Type Select
-- block which converts the data to two's complement format
-- and optionally negates the data. If the ADC Neg2 bit
-- (Register 26) is low, then the input data is treated in
-- offset binary format, and it is converted to two's
-- complement format. If the input data is already in two's
-- complement (ADC NEG2 bit is high), then no format
-- conversion is performed. The data for each channel may be
-- negated by setting the the Invert bit (Register 26) high.
-- Lastly, the data may be DC offset in one of two ways. A DC
-- offset in the ADC can be nulled out by subtracting the
-- amount of the offset. The required offset is determined by
-- sampling the input data with no signal present using the
-- board-level signal GRABOFFSET. The result is stored in the
-- Latched Offset Value register (Registers 57-60) and
-- subtracted from the input data if the Selct bit (Registers
-- 53-56) is high. Alternatively, an external offset of up to
-- may be applied through the DC Offset Correction register
-- (Registers 53-56). This value is added to the input data
-- when the Selct bit is low. The offset correction adder
-- produces 11-bits which is limited to plus or minus 511 to
-- ensure that saturation will be symmetric. A two-to-one
-- multiplexer is incorporated to allow test patterns to be
-- injected into the channel.
--
--
```

RD-24,288

C-2

```
LIBRARY ieee, qcard, compass_lib;
USE ieee.std_logic_1164.all;
USE compass_lib.compass.ALL;
USE compass_lib.stdcomp.ALL;
--compass compile_off
USE compass_lib.compass_etc.all;
USE compass_lib.compass_arith.all;
--compass compile_on ENTITY input_if IS
    PORT(-- Pipeline In from A/D Converter
        TRegDataOut    : OUT integer RANGE -512 TO 511;
        OffsetvalueOut : OUT integer RANGE -512 TO 511;
        ADCinput       : IN  integer RANGE -512 TO 511;
        -- Pipeline Out to Gain/Offset Section
        PipelineOut    : OUT integer RANGE -512 TO 511;
        -- Misc Control from control section
        TPpulse        : IN  integer RANGE -512 TO 511;
        OffsetIn       : IN  integer RANGE  -64 TO  63;
        RegOffsetRead  : IN  std_ulogic;
        Use_OffsetIn   : IN  std_ulogic;
        ------------------------------------------
        --  Use_OffsetIn When set Low the OffsetIn value is
        --  used when set High the Calibration value is used.
        ------------------------------------------
        TRegSelect     : IN  std_ulogic;

------------------------------------------
        --  When TRegSelect bit is 1 the data is comming from
        --  the TPpulse
        ------------------------------------------
        --  clocks and reset
        Inv_ADCinput   : IN  std_ulogic;
        Latch_Offset   : IN  std_ulogic;
        ------------------------------------------
        -- When the TwosCompSel bit is low the A/D Data must
        -- be offset binary and need to be converted to
        -- Twoscomplement representation by inverting the
        -- MSB bit.
        ------------------------------------------
        TwosCompSel    : IN  std_ulogic;
        Clk40p0        : IN  std_ulogic);
END input_if;

ARCHITECTURE Behavel OF input_if IS
-------------------------------------------------------------
--    SYNTHESIS DIRECTIVES/CONSTRAINTS
-------------------------------------------------------------
--    compass frequency 40 Clk40p0
--    compass drive 20 ADCinput
```

RD-24,288

C-3

```
--  compass drive 0 clk40p0
------------------------------------------------------------
--  Registered A/D input signals
    SIGNAL Reg_ADCinput: integer RANGE -512 TO 511;  -- 10 Bits
    SIGNAL Offsetvalue : integer RANGE -512 TO 511;  -- 10 Bits
    SIGNAL TempDataOut : integer RANGE -512 TO 511;  -- 10 Bits
    SIGNAL clk_Latch_Offset : std_ulogic;

BEGIN  -- Behave1

------------------------------------------------------------
--  register the incoming ADC data
------------------------------------------------------------

RiseRegs : PROCESS (Clk40p0)
    BEGIN
        IF (Clk40p0'EVENT and (Clk40p0 = '1')) THEN
    Reg_ADcInput     <= ADCinput;
        END IF;
    END PROCESS RiseRegs;

FallingRegs : PROCESS (Clk40p0)
    BEGIN
        IF (Clk40p0'EVENT and (Clk40p0 = '1')) THEN
            clk_Latch_Offset <= Latch_Offset AND
NOT(RegOffsetRead);
        END IF;
    END PROCESS FallingRegs;

Latchoffset : PROCESS (clk_Latch_Offset)
    BEGIN
        IF (clk_Latch_Offset'EVENT and (clk_Latch_Offset =
'1'))  THEN
            Offsetvalue   <= TempDataOut;  -- latch
        END IF;
    END PROCESS Latchoffset;

------------------------------------------------------------
    --  Process:  OffsetBinaryConverter
    --  Purpose:  Flip the MSB (offset the data)
    --            If Inv_ADCinput is high, bit [8:0] get
    --            inverted and bit 9 MSB unchanged
    --            (complement data). Provides range
    --            correction on A/D input data
    --            If Inv_ADCinput is low, bit [8:0]
    --            unchnaged and bit 9 MSB is complemented
    --            (OffsetBinary).
    --  Inputs:   Input data, TwosCompSel, Inv_ADCinput
    --  Outputs:  Twos Comp Input Data
    --            converted A/D data
------------------------------------------------------------
```

RD-24,288

```
                              C-4

OffsetBinaryConverter : PROCESS (Clk40p0, TRegSelect,
    TPpulse, TwosCompSel)
        VARIABLE TenBitVector : signed_vector(9 DOWNTO 0);
        VARIABLE PipeResult   : integer RANGE -511 TO 511;
        VARIABLE TempPipe1    : signed_vector(10 DOWNTO 0);

BEGIN -- PROCESS OffsetBinaryConverter
        IF (Clk40p0'EVENT and (Clk40p0 = '1')) THEN
            TenBitVector         :=
Sign_Extend(To_SignedVector(Reg_AdcInput,10),10);
            IF (TwosCompSel = '0') THEN  -- must be Offset
              Binary
                    TenBitVector(9) := NOT TenBitVector(9);
                END IF;
            XorVector : FOR i IN TenBitVector'LOW TO
            TenBitVector'HIGH LOOP
                    TenBitVector(i) := TenBitVector(i) XOR
                    Inv_ADCinput;
            END LOOP XorVector;
            TempDataOut         <= To_Integer(TenBitVector(9
                                    DOWNTO 0));

-- Process:  OffsetSection
        -- Purpose:  Add in the offset passed in from the
        --          Control Register and Inv_ADCinput for 2's
        --          complement representation
        -- Inputs:   OffsetIn & the pipeline data
        -- Outputs:  data which has been offset and overflow
        --           checked IF (Use_OffsetIn = '0') THEN
                TempPipe1    := Sign_Extend(TenBitVector,11)
                              + Sign_Extend (To_SignedVector
                                (OffsetIn,7),11)
                              +Inv_ADCinput;
            ELSE
                TempPipe1    := Sign_Extend(TenBitVector,11) -
                                Sign_Extend (To_SignedVector
                                (Offsetvalue,10),11) +
                                Inv_ADCinput;
            END IF;

-- Process:  Saturation Limit
        -- Purpose:  Perform saturation function to limit the
        --           output range
        --           to (-511 to +511).
        -- Inputs:   TempPipe1
```

36

RD-24,288

C-5

-- Outputs: PipelineOut

---
```
            CASE TempPipe1(10 DOWNTO 9) IS
                WHEN "01" =>    -- overflow detected (512 TO
                                    1023)
                            PipeResult  := +511;
                WHEN "10" => -- overflow detected (-1024 TO
                                    -513)
                            PipeResult  := -511;
                WHEN "11" => -- overflow detected -512
                            IF (TempPipe1(8 DOWNTO 0) =
                                "000000000") THEN
                                PipeResult  := -511;
                            ELSE
                                PipeResult  := To_Integer
                                                    (TempPipe1 (9
                                                     DOWNTO 0));
                            END IF;
                WHEN OTHERS => -- data ok range (-511 TO 511)
                            PipeResult  := To_Integer
                                                    (TempPipe1 (9
                                                     DOWNTO 0));
            END CASE;   -- TempPipe1 (10 DOWNTO 9)
            -- Pass Data on to the output Mux
            CASE TRegSelect IS
                WHEN '0' =>
                    PipelineOut <= PipeResult;
                WHEN '1' =>
                    PipelineOut <= TPpulse;
--compass compile_off
                WHEN OTHERS =>
                    ASSERT false
                        REPORT "Unknown on TRegSelect"
                            SEVERITY Error;
--compass compile_on
            END CASE; -- TRegSelect
        END IF; -- Clk40p0
    END PROCESS OffsetBinaryConverter;
    OffsetvalueOut <= Offsetvalue;
    TRegDataOut    <= TempDataOut;

END Behave1;
```

37

RD-24,288

C-6

2. C++ Code

```
//      Title     :   QCARD (QuadChannelAsicReceiveDelay)
//                    Synthesis Version ASIC Core Interface
//      File name :   input_if.vhd
//      Author    :   Al Itani
//      Created   :   Wednesday January 11, 1995 15:40:00
//      SCCS Revision : 1.14
//      SCCS Rev Date : 6/22/95 16:31:42
//
//      VHDL Work Library    : Qcard
//
//      Module Function Description : Input section need 1 for
//      each channel, 4 total
//      The input stage consists of an Input register
//      Synchronizes the data from the 10-bit ADC to the 40 Mhz
//      clock.  The code conversion control bit selects
//      either a 2s complement or offset binary interface. The
//      data may be offset in one of two ways.  A DC offset in
//      the ADC can be nulled out by subtracting the amount of
//      the offset.The required offset is determined by sampling
//      the input data with no signal present.  The result is
//      stored in the offset calibration register and subtracted
//      from the input data stream if enabled by the offset
//      select bit.  An external offset of up to plus or minus
//      32 may be applied through the external offset register.
//      This value will be added to the input data stream.  Bit-6
//      of the external offset register controls whether the
//      offset calibration or external offset will be applied and
//      whether the value will be subtracted or added.  The
//      offset correction adder produces 11-bits which is
//      "sticky-bit" rounded to 10-bits. "Sticky-bit" rounding is
//      performed to ensure that there is no bias in the
//      rounding procedure resulting in an artificial DC offset
//      in the data.  In addition, the data are limited to plus
//      or minus 511 to insure that saturation will be
//      symetrical. A two-to-one multiplexer is incorporated to
//      allow test patterns to be injected. An ouput register is
//      used to synchronize the data for the next stage.
//LIBRARY ieee, qcard, compass_lib;
//USE ieee.std_logic_1164.all;
//USE compass_lib.compass.ALL;
//USE compass_lib.stdcomp.ALL;
//compass compile_off
//USE compass_lib.compass_etc.all;
//USE compass_lib.compass_arith.all;
//compass compile_on void /*ENTITY*/ input_if /* IS*/
    /*PORT */( // Pipeline In from A/D Converter
             integer&   TRegDataOut,
```

RD-24,288

C-7

```
            integer&  OffsetvalueOut,
                integer  ADCinput,
     // Pipeline Out to Gain/Offset Section
            integer&  PipelineOut,
     // Misc Control from control section
                integer  TPpulse,
                integer  OffsetIn,
            std_ulogic  RegOffsetRead,
            std_ulogic  Use_OffsetIn,
//----------------------------------
//   Use_OffsetIn When set Low  the OffsetIn value is
//   used.
//   When set High the Calibration value is used.
//----------------------------------
            std_ulogic  TRegSelect,
//----------------------------------
//   When TRegSelect bit is 1 the data is comming from
//   the TPpulse
//----------------------------------
//   clocks and reset
            std_ulogic  Inv_ADCinput,
            std_ulogic  Latch_Offset,
//----------------------------------
//   When the TwosCompSel bit is low the A/D Data must
//   be offset binary and need to be converted to
//   Twoscomplement representation by inverting the
//   MSB bit.
//----------------------------------
            std_ulogic  TwosCompSel,
                std_ulogic  Clk40p0){
//END input_if;

//ARCHITECTURE Behave1 OF input_if IS
//----------------------------------------------------
//   SYNTHESIS DIRECTIVES/CONSTRAINTS
//----------------------------------------------------
//compass frequency 40 Clk40p0
//compass drive 20 ADCinput
//compass drive 0 clk40p0
//----------------------------------------------------
     // Registered A/D input signals
/* SIGNAL Reg_ADCinput:integer RANGE -512 TO 511;-- 10 Bits */
  static integer  Reg_ADCinput;
/*SIGNAL Offsetvalue:integer RANGE -512 TO 511;-- 10 Bits */
  static integer  Offsetvalue;
/*SIGNAL TempDataOut:integer RANGE -512 TO 511;-- 10 Bits */
  static integer  TempDataOut;
/*SIGNAL clk_Latch_Offset : std_ulogic; */
  static std_ulogic  clk_Latch_Offset;
//BEGIN  --  Behave1
```

RD-24,288

C-8

```
//------------------------------------------------
      //   register the incoming ADC data
//------------------------------------------------
/*      RiseRegs : PROCESS   */ if ( Clk40p0.EVENT )
   {
//      BEGIN
          if (Clk40p0.EVENT && (Clk40p0 == 1 )) { // THEN
             Reg_ADCinput     <= ADCinput;
          } // END IF;
   } // END PROCESS RiseRegs;

/*      FallingRegs : PROCESS   */ if ( Clk40p0.EVENT )
   {
//      BEGIN
          if (Clk40p0.EVENT && (Clk40p0 == 1 )) { // THEN
             clk_Latch_Offset <= (Latch_Offset &
!(RegOffsetRead));
          } // END IF;
   } // END PROCESS FallingRegs;

/*      Latchoffset : PROCESS   */ if ( clk_Latch_Offset.EVENT )
   {
//      BEGIN
          if (clk_Latch_Offset.EVENT && (clk_Latch_Offset == 1
)) { // THEN
             Offsetvalue    <= TempDataOut; // latch
          } // END IF;
   } // END PROCESS Latchoffset;

//------------------------------------------------
      //  Process:   OffsetBinaryConverter
      //  Purpose:   Flip the MSB (offset the data)
      //             If Inv_ADCinput is high, bit [8:0] get
      //             inverted and bit 9
      //             MSB unchanged (complement data). Provides
      //             range correction on A/D input data
      //             If Inv_ADCinput is low, bit [8:0]
      //             unchnaged and bit 9 MSB is complemented
      //             (OffsetBinary).
      //  Inputs:    Input data, TwosCompSel, Inv_ADCinput
      //  Outputs:   Twos Comp Input Data
      //             converted A/D data //------------------------------------------------
/*OffsetBinaryConverter:PROCESS*/if(Clk40p0.EVENT||TRegSelect
                                                      .EVENT
                                     TPpulse.EVENT||TwosCompSel
                                                      .EVENT)
   {
/*VARIABLE TenBitVector : signed_vector(9 DOWNTO 0);*/
```

RD-24,288

C-9

```
      static signed_vector  TenBitVector(10);
/*VARIABLE PipeResult     : integer RANGE -511 TO 511;*/
      static integer  PipeResult;
/*VARIABLE TempPipe1      : signed_vector(10 DOWNTO 0);*/
      static signed_vector  TempPipe1(11);

//      BEGIN -- PROCESS OffsetBinaryConverter
          if (Clk40p0.EVENT && (Clk40p0 ==  1 )) { // THEN
             TenBitVector        =
Sign_Extend(To_SignedVector(Reg_ADCinput,10),10);
             if (TwosCompSel ==  0 ) { // THEN  -- must be
Offset Binary
                  assign(TenBitVector, 9, ! TenBitVector[9]);
             } // END IF;
/*         XorVector : FOR i IN TenBitVector'LOW TO
TenBitVector'HIGH LOOP */
          int i;
          for (i = 0; i < 10; i++) {
             assign(TenBitVector, i, TenBitVector[i] ^
Inv_ADCinput);
          } // END LOOP XorVector;
          TempDataOut         <= To_Integer(TenBitVector);

//------------------------------------------------------------
//   Process:  OffsetSection
     //   Purpose:   Add in the offset passed in from the
     //              Control Register and Inv_ADCinput for 2's
     //              complement representation
     //   Inputs:    OffsetIn & the pipeline data
     //   Outputs:   data which has been offset and overflow
     //              checked
//------------------------------------------------------------
               if (Use_OffsetIn ==  0 ) { // THEN
               TempPipe1      = Sign_Extend(TenBitVector,11) +
                                 Sign_Extend (To_SignedVector
                                 (OffsetIn,7),11) +
                                 Inv_ADCinput;
               }
               else
{
               TempPipe1      = Sign_Extend(TenBitVector,11) -
                                 Sign_Extend (To_SignedVector
                                 (Offsetvalue,10),11) +
                                 Inv_ADCinput;
               } // END IF;
//------------------------------------------------------------
     //   Process:  Saturation Limit
     //   Purpose:  Perform saturation function to limit the
                    output range to (-511 to +511).
```

RD-24,288

```
                              C-10
    // Inputs:   TempPipe1
    // Outputs:  PipelineOut
//-----------------------------------------------------------
/*          CASE TempPipe1(10 DOWNTO 9) IS */
            switch(BitField(TempPipe1, 10, 9) ) {
                case 1 :   // overflow detected (512 TO 1023)
                        PipeResult   = +511;
                    break;
                case 2 :  // overflow detected (-1024 TO -513)
                        PipeResult   = -511;
                    break;
                case 3 :  // overflow detected -512
                        if (TempPipe1.extract(8, 0) ==
                            "000000000") { // THEN
                            PipeResult   = -511;
                        }
                        else
{
                            PipeResult      = To_Integer
                                              (TempPipe1.extract
                                               (9, 0));
                        } // END IF;
                    break;
                default : // data ok range (-511 TO 511)
                        PipeResult   = To_Integer
                                       (TempPipe1.extract
                                        (9, 0));
            } // END CASE;  --  TempPipe1 (10 DOWNTO 9)
        // Pass Data on to the output Mux
/*          CASE TRegSelect IS */
            switch(TRegSelect ) {
                case 0 :
                    PipelineOut <= PipeResult;
                    break;
                case 1 :
                    PipelineOut <= TPpulse;
//compass compile_off
                    break;
                default :
//                  ASSERT false
                        fprintf(err_file, "Unknown on
                                          TRegSelect\n");
//                  SEVERITY Error;
//compass compile_on
            } // END CASE;  -- TRegSelect
        } // END IF;  -- Clk40p0
    } // END PROCESS OffsetBinaryConverter;
        OffsetvalueOut  = Offsetvalue;
        TRegDataOut     = TempDataOut;

} // END Behave1;
```

What is claimed is:

1. A method for testing an application specific integrated circuit, comprising the steps of:

preprocessing a code that defines the circuit to generate a skeleton program which identifies interface descriptions for the circuit; and compiling data based on the skeleton program to generate at least one test vector to verify functionality of the circuit.

2. The method of claim 1 wherein the code that defines the circuit to be tested is written in (VHSIC) Very High Speed Integrated Circuit (VHDL) Hardware Description Language source code and the step of preprocessing the code comprises the steps of scanning the code and extracting information used to build the skeleton program.

3. The method of claim 1 wherein the step of compiling data to generate at least one test vector comprises the steps of scanning the data to generate tokens, analyzing syntax of the generated tokens to generate statements, and generating test vectors from the generated statements.

4. The method of claim 1 and further comprising the steps of:

simulating the circuit at a functional level;

obtaining functional level test data output using a generated test vector;

simulating the circuit at a circuit level; and obtaining circuit level test data output using a generated test vector.

5. The method of claim 4 and further comprising the step of comparing the functional level test data output with the circuit level test data output.

6. The method of claim 5 wherein the step of comparing the test data output comprises the steps of scanning and filtering the test data, and comparing the filtered test data.

7. The method of claim 5 and further comprising the step of generating a report indicating any timing and value errors.

8. In a system for testing an application specific integrated circuit, a computer including a processor and a memory, said memory having a plurality of programs stored therein, said stored programs comprising:

a preprocessing program for generating a skeleton program which identifies interface descriptions for the circuit; and a compiling program for generating, based on the skeleton program and additional waveform information, at least one test vector to verify functionality of the circuit.

9. The system of claim 8 wherein said preprocessing program is adapted to receive Very High Speed Integrated Circuit (VHSIC) Hardware Description Language (VHDL) source code that defines the circuit to be tested, said preprocessing program being adapted to perform the steps of scanning the code and extracting information used to build the skeleton program.

10. The system of claim 8 wherein said compiling program is adapted to perform the steps of scanning data to generate tokens, analyzing syntax of the generated tokens to generate statements, and generating test vectors from the generated statements.

11. The system of claim 8 wherein the stored programs further comprise:

a first simulating program for simulating the circuit at a functional level and obtaining functional level test data output; and a second simulating program for simulating the circuit at a circuit level and obtaining circuit level test data output.

12. The system of claim 11 wherein the stored programs further comprise a comparison program for comparing the functional level test data output with the circuit level test data output.

13. The system of claim 12 wherein said comparison program performs the steps of scanning and filtering the test data, and comparing the filtered test data.

14. The system of claim 13 wherein said comparison program further performs the steps of generating a report indicating any timing and value errors.

15. Apparatus for testing an application specific integrated circuit, comprising:

a preprocessor for generating a skeleton program which identifies interface descriptions for the circuit; and a compiler for generating, based on the skeleton program, at least one test vector to verify functionality of the circuit.

16. Apparatus in accordance with claim 15 wherein said preprocessor is adapted to receive Very High Speed Integrated Circuit (VHSIC) Hardware Description Language (VHDL) source code that defines the circuit to be tested, said preprocessor being further adapted to perform the steps of scanning the code and extracting information used to build the skeleton program.

17. Apparatus in accordance with claim 15 wherein said compiler is adapted to perform the steps of scanning data to generate tokens, analyzing syntax of the generated tokens to generate statements, and generating test vectors from the generated statements.

18. Apparatus in accordance with claim 15 further comprising:

a first simulator for simulating the circuit at a functional level to obtain functional level test data output; and a second simulator for simulating the circuit at a circuit level to obtain circuit level test data output.

19. Apparatus in accordance with claim 18 further comprising a comparator for comparing the functional level test data output with the circuit level test data output.

20. Apparatus in accordance with claim 19 wherein said comparator is adapted to perform the steps of scanning and filtering the test data, and comparing the filtered test data.

21. A method for translating VHDL code to executable code, comprising the steps of:

classifying each VHDL data type;

assigning a behavior to each classified data type;

parsing the classified VHDL code; and converting the parsed VHDL code syntax into a syntax acceptable for the executable code.

22. The method of claim 21 wherein the step of classifying each VHDL data type comprises the steps of classifying each VHDL data type as an integer, standard logic, standard unsigned logic, standard logic vector, standard unsigned logic vector, and signed vector data types.

23. The method of claim 21 wherein the step of classifying each VHDL data type comprises the step of creating a Queue class having a queue of signals and events.

* * * * *